(12) United States Patent
Kouyama

(10) Patent No.: US 8,604,885 B2
(45) Date of Patent: Dec. 10, 2013

(54) DIFFERENTIAL RING OSCILLATOR-TYPE VOLTAGE CONTROL OSCILLATOR

(76) Inventor: Kunihiko Kouyama, Yokohama (JP)

( * ) Notice: Subject to any disclaimer, the term of this patent is extended or adjusted under 35 U.S.C. 154(b) by 0 days.

(21) Appl. No.: 13/181,025

(22) Filed: Jul. 12, 2011

(65) Prior Publication Data

US 2013/0015894 A1   Jan. 17, 2013

(51) Int. Cl.
*H03K 3/03* (2006.01)

(52) U.S. Cl.
USPC ............................................. 331/57; 331/185

(58) Field of Classification Search
USPC ............................................. 331/45, 57, 185
See application file for complete search history.

(56) References Cited

U.S. PATENT DOCUMENTS

| | | | |
|---|---|---|---|
| 4,972,102 A | | 11/1990 | Reis et al. |
| 5,180,995 A | | 1/1993 | Hayashi et al. |
| 5,412,349 A | * | 5/1995 | Young et al. ............... 331/34 |
| 5,418,499 A | | 5/1995 | Nakao |
| 5,426,398 A | * | 6/1995 | Kuo ............................ 331/57 |
| 5,467,060 A | | 11/1995 | Miyashita |
| 5,469,120 A | | 11/1995 | Nguyen et al. |
| 5,477,198 A | * | 12/1995 | Anderson et al. ........ 331/177 R |
| 5,563,553 A | | 10/1996 | Jackson |
| 5,666,088 A | | 9/1997 | Penza |
| 5,748,048 A | * | 5/1998 | Moyal ......................... 331/34 |
| 5,764,110 A | | 6/1998 | Ishibashi |
| 5,945,883 A | | 8/1999 | Nagasawa et al. |
| 2003/0076180 A1 | | 4/2003 | Murakami |
| 2004/0080342 A1 | | 4/2004 | Murakami |
| 2004/0090276 A1 | | 5/2004 | Kiyose et al. |
| 2004/0251973 A1 | | 12/2004 | Ishida et al. |
| 2007/0080753 A1 | | 4/2007 | Ishida et al. |
| 2009/0261909 A1 | | 10/2009 | Fujino |

FOREIGN PATENT DOCUMENTS

| | | |
|---|---|---|
| JP | 01-157612 | 6/1989 |
| JP | 5-37307 A | 2/1993 |
| JP | 5-191221 A | 7/1993 |
| JP | 06-169237 | 6/1994 |
| JP | 7-74596 A | 3/1995 |
| JP | 8-8651 A | 1/1996 |
| JP | 8-288801 A | 11/1996 |
| JP | 09-223965 A | 8/1997 |
| JP | 9-508780 A | 9/1997 |
| JP | 10-98356 A | 4/1998 |
| JP | 11-017501 | 1/1999 |
| JP | 2001-094418 A | 4/2001 |

(Continued)

OTHER PUBLICATIONS

Office Action dated Nov. 15, 2011, issued in the corresponding Japanese Patent Application No. 2009-299551.

(Continued)

*Primary Examiner* — Levi Gannon
(74) *Attorney, Agent, or Firm* — Buchanan Ingersoll & Rooney PC

(57) ABSTRACT

A voltage control oscillator includes: a voltage-current converter circuit that converts an inputted voltage to a current according to the value of the voltage; a current mirror circuit; a ring oscillator including differential inverters connected in multiple stages; an inverting amplifier; and a buffer. The ring oscillator outputs, from each of the differential inverters, a signal amplitude-limited by a current converted by the voltage-current converter circuit and the current mirror circuit and a voltage applied from the inverting amplifier and the ring oscillator outputs an oscillatory frequency in response to the output signal.

10 Claims, 4 Drawing Sheets

(56) References Cited

FOREIGN PATENT DOCUMENTS

| | | |
|---|---|---|
| JP | 2001-358565 A | 12/2001 |
| JP | 2003-69390 A | 3/2003 |
| JP | 2004-129208 A | 4/2004 |
| JP | 2004-530352 | 9/2004 |
| JP | 2005-20704 A | 1/2005 |
| JP | 2005-500781 A | 1/2005 |
| JP | 2008-301042 A | 12/2008 |
| JP | 2009-260607 A | 11/2009 |
| WO | WO 96/38913 A1 | 12/1996 |
| WO | WO 02/082649 | 10/2002 |
| WO | WO 03/017486 A1 | 2/2003 |

OTHER PUBLICATIONS

Notification of Reasons for Refusal issued in corresponding Japanese Patent Application No. JP 2009-299551, mailed Aug. 21, 2012, and English translation thereof.

\* cited by examiner

DIFFERENTIAL RING OSCILLATOR-TYPE VOLTAGE CONTROL OSCILLATOR

BACKGROUND OF THE INVENTION

1. Technical Field

The present invention relates to a voltage control oscillator (VCO) in a phase-locked loop (PLL) circuit.

2. Background Art

In interface receiver circuits of HDMI and S/PDIF, transfer clock frequency ranges tend to increase. A PLL is used to recover a clock from a received signal. In use of a PLL, a voltage control oscillator (VCO) with a wide frequency variable range and low jitter is necessary.

In Patent Literature 6 and Patent Literature 7, a ring oscillator including a single-ended inverter has odd-numbered stages. In Patent Literature 1, the amplitude of a differential output (62) is fixed by clamping transistors (104, 106) in an inverter (48). In Patent Literature 5, a high level of an inverter is set to a reference potential to limit amplitude. The load of a differential inverter in a ring oscillator according to the related art uses a resistance or an on-resistance of a transistor in a non-saturated region.

TECHNICAL PROBLEM

A frequency variation relative to a change of a control voltage of a VCO is called a gain. In the case where a VCO has a large gain, that is, the VCO has high sensitivity, the VCO reacts with noise leaking from a phase detector through a loop filter, leading to fluctuations in the oscillatory frequency of the VCO (i.e., jitter increases). Thus, jitter of a PLL can be lowered by reducing the gain of the VCO. However, in the case where the gain of the VCO is reduced without changing the range of a control voltage applied to the VCO, the fluctuating range of the oscillatory frequency is smaller as compared with the case where the gain of the VCO is not reduced. Thus, in this approach, a lock frequency range is reduced with low jitter, that is, a lock range is reduced. In specifications demanding low jitter and a wide lock frequency range, the method of reducing the gain of the VCO requires setting of proper points of contradictory parameters.

From experience, however, if the jitter of the VCO itself is high, high jitter may not be reduced even if the cut-off frequency of a loop filter is lowered to reduce noise and the gain of the VCO is reduced. In other words, even if a fixed voltage without fluctuations or jitter is applied as the control voltage of the VCO, jitter cannot be lowered as long as the jitter is outputted from the VCO. Thus, the jitter of the VCO has to be reduced.

An object of the present invention is to provide a voltage control oscillator that can extend the variable range of oscillatory frequencies with low jitter.

SUMMARY OF THE INVENTION

In order to solve the problem, the present invention has the following characteristics:

The present invention is a voltage control oscillator including: a voltage-current converter circuit that converts an inputted voltage to a current according to the value of the voltage; a current mirror circuit; a ring oscillator including differential inverters connected in multiple stages; an inverting amplifier; and a buffer. The ring oscillator outputs, from each of the differential inverters, a signal amplitude-limited by a current converted by the voltage-current converter circuit and the current mirror circuit and a voltage applied from the inverting amplifier, and the ring oscillator outputs an oscillatory frequency in response to the output signal.

According to the present invention, an amplitude is limited by the voltage applied from the inverting amplifier. The amplitude limiting shortens the rise time and fall time of an oscillation signal, thereby reducing the jitter of the voltage control oscillator. The amplitude limiting also eliminates fluctuations in the power supply voltage of the ring oscillator at a high level of the oscillation signal, so that a PSRR (Power Supply Rejection Ratio) decreases. Furthermore, the current is stabilized by the current driving the ring oscillator by means of the differential inverters, so that fluctuations in oscillatory frequency are reduced and lower jitter is obtained. However, the amplitude limiting alone cannot increase the gain of the voltage control oscillator or extend the variable range of oscillatory frequencies. Hence, in the present invention, an amplitude from each of the differential inverters is controlled by a voltage from the inverting amplifier, thereby increasing the gain of the voltage control oscillator and extending the variable range of oscillatory, frequencies. According to the present invention, it is possible to provide a voltage control oscillator that can extend the variable range of oscillatory frequencies with low jitter.

Preferably, the voltage-current converter circuit may include an operational amplifier. Preferably, the ring oscillator may include multiple differential inverters circularly connected in N stages (N is an integer of at least 3). Preferably, the ring oscillator may control a tail current and a load current of the differential inverter according to the current of the voltage-current converter circuit. Preferably, the ring oscillator may switch the output signals of the differential inverters by PMOS transistors and NMOS transistors. Preferably, the ring oscillator may limit the amplitude of the output signal of the differential inverter by clipping transistors. Preferably, the ring oscillator may control an output signal amplitude limiting voltage according to the voltage of the inverting amplifier.

Another aspect of the present invention is a voltage control oscillator including: a voltage-current converter circuit that converts a control voltage to a current; a current mirror circuit that outputs a current depending upon an input from the voltage-current converter circuit; a ring oscillator that is driven by a tail current and a load current that depend upon an input from the current mirror circuit and includes multiple differential inverters, each including clipping transistors for limiting the amplitude of an output signal; an inverting amplifier that outputs a clipping voltage depending upon the input from the voltage-current converter circuit; and a buffer connected to the output side of the ring oscillator. The ring oscillator outputs a controlled signal with a limited amplitude from each of the differential inverters according to the tail current, the load current, and the clipping voltage, and outputs an oscillatory frequency in response to the output signal.

The present invention is a PLL circuit including the voltage control oscillator.

These and other objects, characteristics, aspects, and effects of the present invention will become more apparent from the description taken in connection with the accompanying drawings.

DESCRIPTION OF EMBODIMENTS

Figure 1:
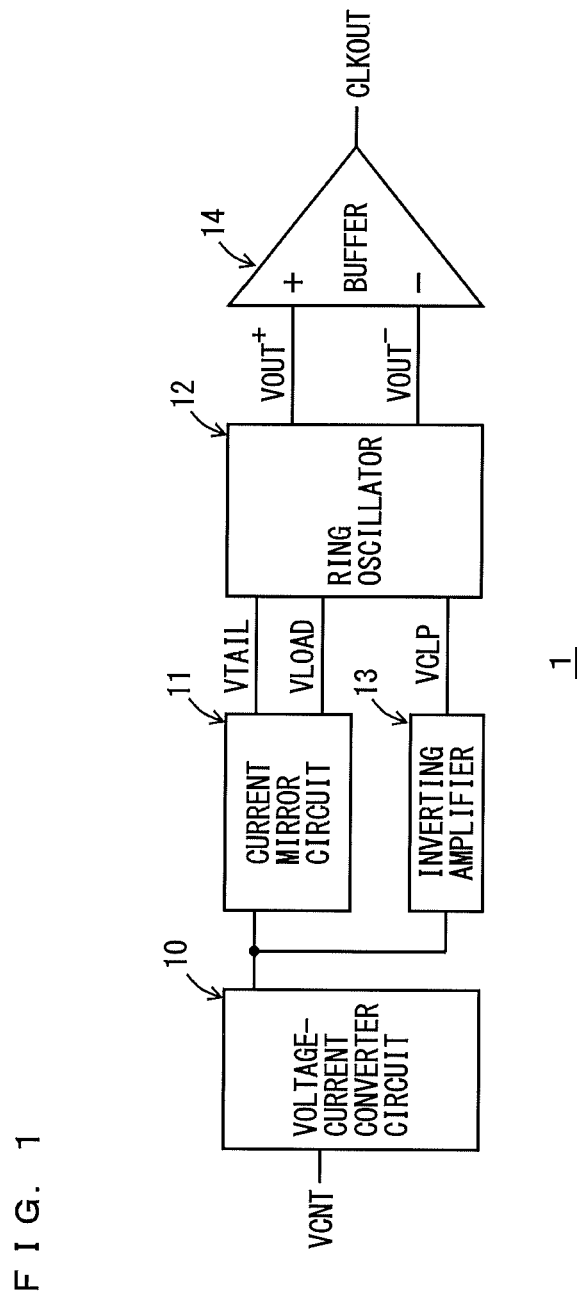
FIG. 1 is a block diagram showing the functional configuration of a voltage control oscillator 1 according to an embodiment of the present invention.

FIG. 1 is a block diagram showing the functional configuration of a voltage control oscillator 1 according to an embodiment of the present invention. The voltage control oscillator 1 includes a voltage-current converter circuit 10, a current mirror circuit 11, a ring oscillator 12, an inverting amplifier 13, and a buffer 14. For example, the voltage control oscillator 1 may be used in a PLL circuit provided with a phase detector, a charge pump, and a feedback divider. The phase detector detects, for example, a phase difference between a reference oscillation signal and a feedback signal from the feedback divider. The charge pump inputs a control voltage VCNT to the voltage control oscillator 1 according to the detected phase difference. The voltage control oscillator 1 controls an oscillatory frequency according to the control voltage VCNT. In the present invention, the application of the voltage control oscillator 1 is not limited to the PLL.

Figure 2:
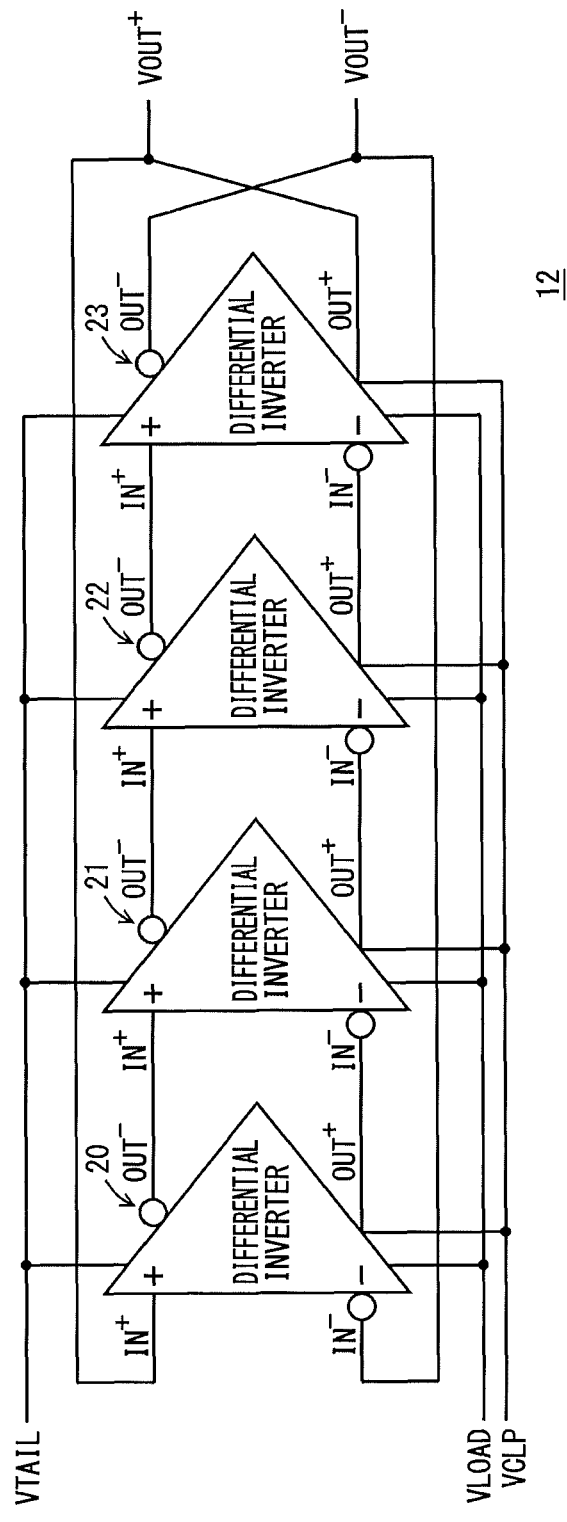
FIG. 2 is a block diagram showing a functional configuration including differential inverters 20, 21, 22, and 23 used in even-numbered stages in a ring oscillator 12.

FIG. 2 is a block diagram showing a functional configuration including differential inverters 20, 21, 22, and 23 used in even-numbered stages in the ring oscillator 12. FIG. 2 shows four differential inverters, but the number of differential inverters is not particularly limited as long as at least four even-numbered differential inverters are provided. In the case where even-numbered differential inverters are used, OUT⁻ of the final stage is inputted to IN⁻ of the first stage and OUT⁺ of the final stage is inputted to IN⁺ of the first stage.

Figure 3:
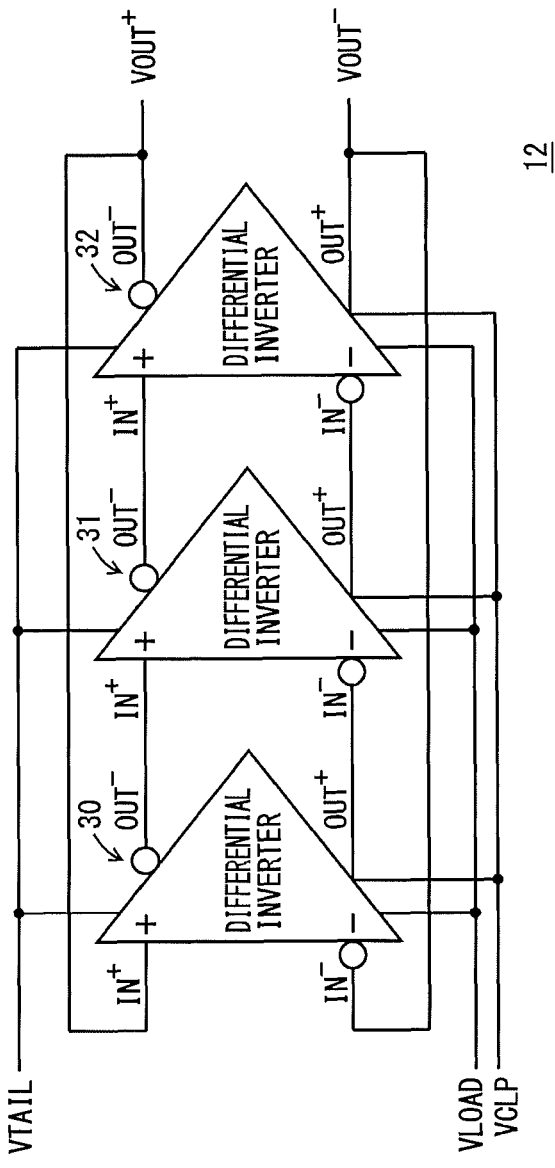
FIG. 3 is a block diagram showing a functional configuration including differential inverters 30, 31, and 32 used in odd-numbered stages in the ring oscillator 12.

FIG. 3 is a block diagram showing a functional configuration including differential inverters 30, 31, and 32 used in odd-numbered stages in the ring oscillator 12. FIG. 3 shows three differential inverters, but the number of differential inverters is not limited as long as at least three odd-numbered differential inverters are provided. In the case where odd-numbered differential inverters are used, OUT⁻ of the final stage is inputted to IN⁺ of the first stage and OUT⁺ of the final stage is inputted to IN⁻ of the first stage.

Figure 4:
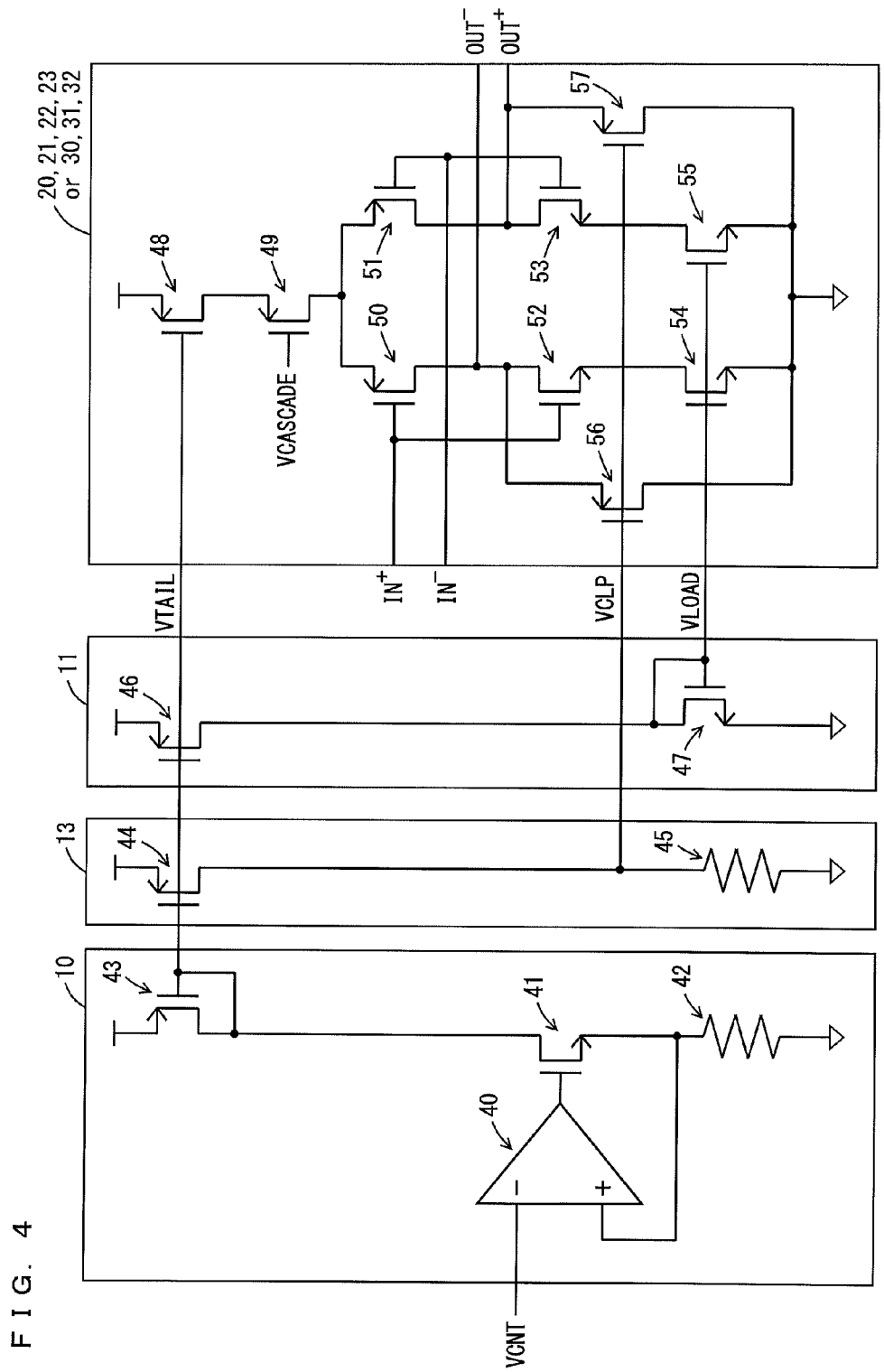
FIG. 4 is a circuit diagram showing the voltage control oscillator 1 according to the embodiment.

FIG. 4 is a circuit diagram showing the voltage control oscillator 1 according to the embodiment. FIG. 4 shows a circuit example of a differential inverter constituting the ring oscillator 12. As shown in FIG. 2 or 3, the differential inverters are connected in multiple stages. In FIG. 4, components having the same functions as in FIGS. 1, 2, and 3 are indicated by the same reference numerals.

The voltage-current converter circuit 10 includes an operational amplifier 40, an NMOS transistor 41, a resistor 42, and a PMOS transistor 43. The voltage-current converter circuit 10 converts the inputted control voltage VCNT to a current. The configuration of the voltage-current converter circuit 10 is not limited to the example of FIG. 4.

The current mirror circuit 11 includes a PMOS transistor 46 and an NMOS transistor 47. The current converted by the voltage-current converter circuit 10 is supplied to the PMOS transistor 46 and the differential inverters. Current VTAIL supplied to the PMOS transistor 46 regulates the tail currents of the differential inverters. The current VTAIL obtained by the NMOS transistor 47 of the current mirror circuit 11 regulates the load currents of the differential inverters. The load current is supplied to load transistors 54 and 55. VCASCADE denotes a reference voltage that causes transistors 48 and 49 to act as cascode current sources.

A tail current from the current source 48 is supplied to a PMOS transistor 50 and a PMOS transistor 51. Except for connection between the final stage and the first stage of even-numbered stages, OUT⁻ and IN⁺ are connected to each other and OUT⁺ and IN⁻ are connected to each other. The output OUT⁻ of the differential inverter performs switching so as to turn on the PMOS transistor 50 and turn off an NMOS transistor 52 at a rising edge and turn off the PMOS transistor 50 and turn on the NMOS transistor 52 at a falling edge. The output OUT⁺ of the differential inverter performs switching so as to turn on the PMOS transistor 51 and turn off an NMOS transistor 53 at a rising edge and turn off the PMOS transistor 51 and turn on the NMOS transistor 53 at a falling edge.

The inverting amplifier 13 includes a PMOS transistor 44 and a resistor 45. A current corresponding to VCNT passes through the PMOS transistor 44 and the resistor 45. Thus, a VCLP (clip transistor control voltage) regulates a voltage corresponding to VCNT. The clipping voltages of clipping transistors 56 and 57 are each obtained by adding a voltage Vgs(Pch) to the voltage VCLP. Thus, a high level of the oscillation signal of a VCO core is determined by the voltage VCLP. Consequently, the amplitude of the oscillation signal of the VCO core is controlled by the voltage level of VCNT. In other words, the gate voltages of clipping transistors 56 and 57 regulate the amplitude of the oscillation signal.

The clip transistor control voltage VCLP, which is the output of the inverting amplifier 13, is supplied to the clipping transistors 56 and 57. The clip transistor control voltage VCLP fluctuates with the control voltage VCNT. The amplitudes of the outputs OUT⁺ and OUT⁻ of the differential inverter are controlled according to the control voltage VCLP. The lower the control voltage VCNT, the larger the amplitudes of the outputs OUT⁺ and OUT⁻. The higher the control voltage VCNT, the smaller the amplitudes of the outputs OUT⁺ and OUT⁻. Thus, the output amplitude of the ring oscillator can be controlled according to a frequency control voltage. The configuration of the inverting amplifier 13 is not limited to that of FIG. 4 as long as the inverting amplifier 13 outputs a voltage according to the control voltage VCNT.

The jitter of the voltage control oscillator 1 is the jitter of the ring oscillator 12. In the case where the differential inverter constituting the ring oscillator 12 has a small gain, that is, the rise time and the fall time of the oscillation signal is extended, the jitter increases. In the case of a single-ended ring oscillator including no clipping transistors, fluctuations in power supply voltage occur at a high level of an oscillation signal without being changed, so that a PSRR increases (deterioration). In the present embodiment, a current is stabilized by current driving the inverters of the ring oscillator 12 as differential inverters, so that fluctuations in oscillatory frequency are reduced and lower jitter is obtained. Moreover, the addition of the clipping transistors reduces the amplitude of the oscillation signal and reduces a rise time at the inclination of the same rising edge, achieving oscillation at high frequencies. In this state, a change of the oscillatory frequency of the VCO leads to a change of a rise/fall time while the amplitude of the oscillation signal is fixed. The clipping transistors used as such can reduce a PSRR (improvement) and achieve high frequency oscillation. Furthermore, the inverters are raised in gain and thus, the VCO can be configured with low jitter.

In the case of an application with low jitter and a wide locking frequency range, that is, an application with a wide lock range, only the provision of clipping transistors may lead to an insufficient lock range. Thus, in the present embodiment, a configuration for extending the lock range of the PLL is adopted while taking advantage of the clipping transistors. In the VCO including the clipping transistors, the oscillatory frequency is controlled by the rise/fall time. Thus, in order to extend the frequency control range, it is necessary to control the amplitude of the oscillation signal as well as the rise/fall time. In the present embodiment, the amplitude of the oscillation signal can be controlled by controlling the clipping voltage VCLP applied to the clipping transistors, thereby increasing the gain of the VCO and the variable range of frequencies. Consequently, the lock range can be extended.

In the present embodiment, the ring oscillator 12 is a differential circuit, so that the differential inverters can be provided in odd-numbered or even-numbered stages, stabilizing oscillation.

The loads of the differential inverters serve as current sources and the values of the tail current and the load current are determined according to the control voltage. Thus, the oscillatory frequency of the ring oscillator 12 can be controlled by a current depending upon the control voltage, stabilizing oscillation.

The output of the differential inverter switches currents by the PMOS transistors 50 and 51 and the NMOS transistors 52 and 53, achieving low jitter.

The output voltages OUT$^+$ and OUT$^-$ are controlled by the clipping transistors 56 and 57, thereby reducing the influence of fluctuations in power supply voltage on jitter of the output signal of the ring oscillator. Moreover, the output amplitude is changed according to the frequency control voltage, thereby increasing the variable range of frequencies.

The output amplitude is changed according to the frequency control voltage supplied from the inverting amplifier 13.

In the present invention, the variable range of frequencies can be increased by controlling the amplitude of the output signal as well as the rise time and fall time of the output signal of the differential inverter, that is, the oscillatory frequency according to a current.

While the present invention has been specifically described, all the aspects of the foregoing explanation are merely exemplary of the present invention and are not intended to limit the scope of the present invention. It is to be understood that various modifications and changes can be made without departing from the scope of the present invention.

CITATION LIST

Patent Literature

Patent Literature 1: U.S. Pat. No. 5,563,553
Patent Literature 2: Japanese Patent Laid-Open No. 2005-20704
Patent Literature 3: Japanese Patent Laid-Open No. 2003-69390
Patent Literature 4: Japanese Patent Laid-Open No. H8-8651
Patent Literature 5: Japanese Patent Laid-Open No. H10-98356
Patent Literature 6: Japanese Patent Laid-Open No. H5-191221
Patent Literature 7: Japanese Patent Laid-Open No. H7-74596
Patent Literature 8: Japanese Patent Laid-Open No. H8-288801

What is claimed is:

1. A voltage control oscillator comprising:
a voltage-current converter circuit that converts an inputted frequency control voltage to a current according to a value of the voltage;
a current mirror circuit that outputs a current depending upon an input from the voltage-current converter circuit;
a ring oscillator including differential inverters connected in multiple stages;
an inverting amplifier; and
a buffer,
wherein the voltage-current converter circuit supplies the current obtained by converting the frequency control voltage to the inverting amplifier by a current mirror formed by a combination of a plurality of transistors in the voltage-current converter circuit and the inverting amplifier,
the inverting amplifier inputs, in a clipping transistor of the ring oscillator, a voltage which changes depending upon the frequency control voltage by the current supplied from the voltage-current converter, and
the ring oscillator provides the current converted by the voltage-current converter circuit and the current mirror circuit as a tail current and a load current and provides the voltage supplied by the inverting amplifier as a clipping voltage, uses the tail current, the load current, and the clipping voltage to output an amplitude-limited signal from each of the differential inverters and outputs an oscillatory frequency in response to the output signal.

2. The voltage control oscillator according to claim 1, wherein the voltage-current converter circuit includes an operational amplifier.

3. The voltage control oscillator according to claim 1, wherein the ring oscillator includes multiple differential inverters circularly connected in N stages, N being an integer of at least 3.

4. The voltage control oscillator according to claim 3, wherein the ring oscillator controls the tail current and the load current of the differential inverter according to the current of the voltage-current converter circuit.

5. The voltage control oscillator according to claim 3, wherein the ring oscillator switches output signals of the differential inverters by PMOS transistors and NMOS transistors.

6. The voltage control oscillator according to claim 3, wherein the ring oscillator limits an amplitude of an output signal of the differential inverter by the clipping transistor.

7. A voltage control oscillator comprising:
a voltage-current converter circuit that converts an inputted frequency control voltage to a current;
a current mirror circuit that outputs a current depending upon an input from the voltage-current converter circuit;
a ring oscillator that is driven by a tail current and a load current that depend upon an input from the current mirror circuit, and includes multiple differential inverters, each including clipping transistors for limiting an amplitude of an output signal;
an inverting amplifier; and
a buffer connected to an output side of the ring oscillator,
wherein the voltage-current converter circuit supplies the current obtained by converting the frequency control voltage to the inverting amplifier by a current mirror formed by a combination of a plurality of transistors in the voltage-current converter circuit and the inverting amplifier,
the inverting amplifier inputs, in the clipping transistors of the ring oscillator, a voltage which changes depending upon the frequency control voltage by the current supplied from the voltage-current converter, and
the ring oscillator outputs a controlled signal with a limited amplitude from each of the differential inverters according to the tail current, the load current, and the clipping voltage, and outputs an oscillatory frequency in response to the output signal.

8. A PLL circuit comprising a voltage control oscillator, the voltage control oscillator comprising:
a voltage-current converter circuit that converts an inputted frequency control voltage to a current according to a value of the voltage;
a current mirror circuit that outputs a current depending upon an input from the voltage-current converter circuit;
a ring oscillator including differential inverters connected in multiple stages, and a clipping transistor;
an inverting amplifier; and
a buffer,
wherein the voltage-current converter circuit supplies the current obtained by converting the frequency control voltage to the inverting amplifier by a current mirror formed by a combination of a plurality of transistors in the voltage-current converter circuit and the inverting amplifier,
the inverting amplifier inputs, in the clipping transistors of the ring oscillator, a voltage which changes depending upon the frequency control voltage by the current supplied from the voltage-current converter, and
the ring oscillator provides the current converted by the voltage-current converter circuit and the current mirror circuit as a tail current and a load current, provides the voltage supplied by the inverting amplifier as a clipping voltage, uses the tail current, the load current and the clipping voltage to output an amplitude-limited signal from each of the differential inverters, and outputs an oscillatory frequency in response to the output signal.

9. A PLL circuit comprising a voltage control oscillator, the voltage control oscillator comprising:
a voltage-current converter circuit that converts an inputted frequency control voltage to a current;
a current mirror circuit that outputs a current depending upon an input from the voltage-current converter circuit;
a ring oscillator that is driven by a tail current and a load current that depend upon an input from the current mirror circuit and includes multiple differential inverters, each including clipping transistors for limiting an amplitude of an output signal;
an inverting amplifier; and
a buffer connected to an output side of the ring oscillator,
wherein the voltage-current converter circuit supplies the current obtained by converting the frequency control voltage to the inverting amplifier by a current mirror formed by a combination of a plurality of transistors in the voltage-current converter circuit and the inverting amplifier,
the inverting amplifier inputs, in the clipping transistors of the ring oscillator, a voltage which changes depending upon the frequency control voltage by the current supplied from the voltage-current converter, and
the ring oscillator outputs a controlled signal with a limited amplitude from each of the differential inverters according to the tail current, the load current, and the clipping voltage, and outputs an oscillatory frequency in response to the output signal.

10. A voltage control oscillator comprising:
a voltage-current converter circuit that converts an inputted frequency control voltage to a current according to a value of the voltage;
a current mirror circuit that receives an input from the voltage-current converter circuit and outputs a current depending upon the input from the voltage-current converter circuit;
a ring oscillator including differential inverters connected in multiple stages, and a clipping transistor;
an inverting amplifier that inputs, in the clipping transistor of the ring oscillator, a voltage which changes depending upon the frequency control voltage in accordance with the input from the voltage-current converter circuit; and
a buffer,
wherein the ring oscillator provides the current converted by the voltage-current converter circuit and the current mirror circuit as a tail current and a load current, provides the voltage supplied by the inverting amplifier as a clipping voltage, uses the tail current, the load current and the clipping voltage to output an amplitude-limited signal from each of the differential inverters, and outputs an oscillatory frequency in response to the output signal.

* * * * *